US012107498B2

(12) United States Patent
Rizzolatti et al.

(10) Patent No.: US 12,107,498 B2
(45) Date of Patent: Oct. 1, 2024

(54) POWER CONVERSION AND FLYING CAPACITOR IMPLEMENTATIONS

(71) Applicant: Infineon Technologies Austria AG, Villach (AT)

(72) Inventors: Roberto Rizzolatti, Villach (AT); Stefano Saggini, Udine (IT); Matthias J. Kasper, Villach (AT); Christian Rainer, Magdalensberg (AT); Mario Ursino, Buja (IT)

(73) Assignee: Infineon Technologies Austria AG, Villach (AT)

( * ) Notice: Subject to any disclaimer, the term of this patent is extended or adjusted under 35 U.S.C. 154(b) by 248 days.

(21) Appl. No.: 17/147,752

(22) Filed: Jan. 13, 2021

(65) Prior Publication Data

US 2022/0224231 A1    Jul. 14, 2022

(51) Int. Cl.
| | | |
|---|---|---|
| *H02M 3/158* | (2006.01) | |
| *G01R 19/165* | (2006.01) | |
| *H02M 3/07* | (2006.01) | |
| *H02J 7/00* | (2006.01) | |
| *H02J 7/34* | (2006.01) | |
| *H02M 1/00* | (2006.01) | |
| *H02M 1/088* | (2006.01) | |

(52) U.S. Cl.
CPC ...... *H02M 3/158* (2013.01); *G01R 19/16538* (2013.01); *H02M 3/07* (2013.01); *H02J 7/0019* (2013.01); *H02J 7/345* (2013.01); *H02M 1/0025* (2021.05); *H02M 1/088* (2013.01)

(58) Field of Classification Search
None
See application file for complete search history.

(56) References Cited

U.S. PATENT DOCUMENTS

| | | | |
|---|---|---|---|
| 10,541,623 B1 * | 1/2020 | Michal | H02M 7/487 |
| 10,601,311 B2 * | 3/2020 | Meyvaert | H02M 3/07 |
| 10,615,697 B1 | 4/2020 | Ferrari et al. | |
| 10,651,731 B1 | 5/2020 | Rainer et al. | |
| 10,985,653 B1 * | 4/2021 | Cai | H02M 1/0003 |
| 11,011,988 B1 * | 5/2021 | Jefremow | H02M 1/0064 |
| 11,581,796 B2 * | 2/2023 | Yan | H02M 1/0025 |
| 2005/0189949 A1 * | 9/2005 | Shimizu | G01R 31/3835 324/434 |
| 2016/0344214 A1 | 11/2016 | Petersen et al. | |
| 2019/0348913 A1 * | 11/2019 | Zhang | H02M 1/08 |

(Continued)

FOREIGN PATENT DOCUMENTS

| | | | | |
|---|---|---|---|---|
| CN | 107612389 A | 5/2020 | | |
| CN | 115441757 | * 12/2022 | | H02M 7/219 |

OTHER PUBLICATIONS

Extended Search Report, EP 22 15 1108, dated Jun. 3, 2022, pp. 1-7.
EP Office action , EP 22 151 108.2, Sep. 15, 2023, pp. 1-7.

*Primary Examiner* — Kyle J Moody
(74) *Attorney, Agent, or Firm* — Armis IP Law, LLC

(57) ABSTRACT

An apparatus such as a power converter includes a first flying capacitor, a second flying capacitor, etc., an inductor, and a network of switches. The network of switches controls conveyance of energy from the multiple flying capacitors to the inductor. The inductor converts the received energy into an output voltage to power a load. A magnitude of the respective voltage on each of the flying capacitors is substantially the same.

22 Claims, 16 Drawing Sheets

(56) References Cited

U.S. PATENT DOCUMENTS

| | | | | |
|---|---|---|---|---|
| 2020/0350817 A1* | 11/2020 | De | .................. | H02M 3/155 |
| 2022/0115953 A1* | 4/2022 | Rainer | ................ | H02M 3/1584 |
| 2022/0190724 A1* | 6/2022 | Petersen | ................ | H02M 3/07 |
| 2022/0286049 A1* | 9/2022 | Fujii | .................... | H02M 3/158 |
| 2023/0353036 A1* | 11/2023 | Rizzolatti | ............. | H02M 1/009 |

* cited by examiner

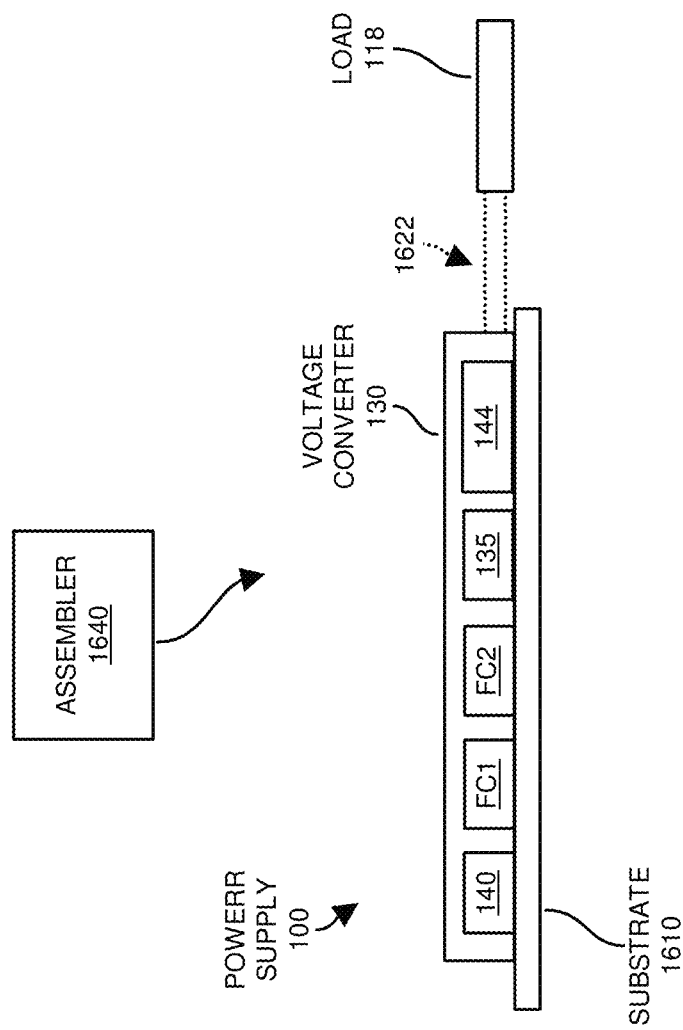

POWER CONVERSION AND FLYING CAPACITOR IMPLEMENTATIONS

BACKGROUND

Data centers such as operated by Google™, Facebook™, and others provide indispensable services for our society. The energy consumption for all data centers worldwide is around 2% of overall electric energy usage. Therefore, datacenter providers are constantly looking to improve the efficiency of power conversion in order to save energy or to be able to increase the CPU/GPU/ASIC, etc., power of servers in existing data centers. Machine learning and artificial intelligent architectures require very powerful GPUs or custom designed ASICs to meet the required calculation power.

Higher voltage distribution and efficient conversion systems are necessary to reduce losses and increase the overall power density of the conversion system. In the last few years 48V DC at the rack level has been introduced by vendors enabling several different scenarios to provide high power to digital load, such as CPU/ASIC/GPU. These architectures are coordinated, e.g., by the Open compute consortium, currently OCP 3.0 is the most modern architecture supporting 48V DC distribution within the rack.

BRIEF DESCRIPTION

Implementation of clean energy (or green technology) is very important to reduce our impact as humans on the environment. In general, clean energy includes any evolving methods and materials to reduce an overall toxicity on the environment from energy consumption.

This disclosure includes the observation that raw energy, such as received from green energy sources or non-green energy sources, typically needs to be converted into an appropriate form (such as desired AC voltage, DC voltage, etc.) before it can be used to power end devices such as servers, computers, mobile communication devices, wireless base stations, etc. In certain instances, energy is stored in a respective one or more battery resource. Alternatively, energy is received from a voltage generator. Regardless of whether energy is received from green energy sources or non-green energy sources, it is desirable to make most efficient use of raw energy (such as storage and subsequent distribution) provided by such systems to reduce our impact on the environment. This disclosure contributes to reducing our carbon footprint and better use of energy via more efficient energy conversion.

This disclosure further includes the observation that power conversion efficiency of conventional power supplies can be improved. For example, to this end, embodiments herein include novel ways of providing improved performance of power conversion via implementation of multiple flying capacitors.

More specifically, embodiments herein include an apparatus comprising a first flying capacitor, a second flying capacitor, an inductor, and a network of switches. The network of switches controls conveyance of energy from the first flying capacitor and the second flying capacitor to the inductor. The inductor converts the received energy into an output voltage to power a load.

In still further example embodiments, the inductor receives the energy as first current from the first flying capacitor and second current from the second flying capacitor.

In one embodiment, during power conversion, the first flying capacitor stores a first voltage; the second flying capacitor stores a second voltage. Controlled switching operation of the network of switches as discussed herein causes a magnitude of the first voltage to be substantially equal to a magnitude of the second voltage.

In further example embodiments, the first flying capacitor stores a first voltage; the second flying capacitor stores a second voltage. The conveyance of the energy from the first flying capacitor and the second flying capacitor to the inductor over each of multiple control cycles of operating/controlling the network of switches substantially equalizes a magnitude of the first voltage to a magnitude of the second voltage. Thus, embodiments herein include an implementation of a respective power converter that naturally equalizes a magnitude of a first flying capacitor voltage and a second flying capacitor voltage.

In still further embodiments, the network of switches simultaneously supplies current from the first flying capacitor and the second flying capacitor to the inductor that produces the output voltage.

Further embodiments herein include, via the network of switches, coupling the first flying capacitor and the second flying capacitor in series between a first reference voltage and a second reference voltage at different times. The inductor receives the first current and the second current at a node coupling the first flying capacitor to the second flying capacitor.

In accordance with yet further example embodiments, the network of switches includes first switches and second switches as well as a controller. The controller regulates a magnitude of the output voltage via controlling the first switches and second switches using a same duty cycle. In one embodiment, the controller determines the duty cycle based on an error voltage derived from comparing a magnitude of the output voltage to a setpoint reference voltage.

Further embodiments herein include, via a controller, implementing controlled switching of the network of switches in accordance with a 2-phase buck conversion of an input voltage into the output voltage via the energy received from the first flying capacitor and the second flying capacitor.

In still further example embodiments, the controller switches between multiple modes including one or more of: i) a first mode in which the first flying capacitor and the second flying capacitor are connected in series between an input voltage and ground, the first flying capacitor being connected to the input voltage while the second flying capacitor is connected to the ground reference, the inductor coupled to a node coupling the first flying capacitor to the second flying capacitor; ii) a second mode in which the second flying capacitor and the first flying capacitor are connected in series between an input voltage and ground, the second flying capacitor being connected to the input voltage while the first flying capacitor is connected to the ground reference, the inductor coupled to a node coupling the second flying capacitor to the first flying capacitor; iii) a third mode in which the inductor is coupled to ground, and iv) a fourth mode in which the network of switches is operative to provide connectivity of the inductor to the input voltage.

Note that embodiments herein are useful over conventional techniques. For example, in contrast to conventional techniques, the novel power supply as described herein provides high efficiency of converting an input voltage to a respective output voltage via unique regulation of received flying capacitor voltages. More specifically, embodiments herein include a novel method, apparatus, system, etc., to balance flying capacitor voltages of a multi-level interleaved flying capacitor buck converter.

These and other more specific embodiments are disclosed in more detail below.

Note that any of the resources as discussed herein can include one or more computerized devices, apparatus, hardware, etc., execute and/or support any or all of the method operations disclosed herein. In other words, one or more computerized devices or processors can be programmed and/or configured to operate as explained herein to carry out the different embodiments as described herein.

Yet other embodiments herein include software programs to perform the steps and/or operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to a method, system, computer program product, etc., that supports operations as discussed herein.

One embodiment herein includes a computer readable storage medium and/or system having instructions stored thereon to facilitate generation of an output voltage to power a load. The instructions, when executed by computer processor hardware, cause the computer processor hardware (such as one or more co-located or disparately located processor devices or hardware) to: via control of a network of switches, charge a first flying capacitor and a second flying capacitor; convey first current from the first flying capacitor and second current from the second flying capacitor to an inductor; and produce an output voltage to power a load via the first current and the second current.

The ordering of the steps above has been added for clarity sake. Note that any of the processing steps as discussed herein can be performed in any suitable order.

Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

Note further that although embodiments as discussed herein are applicable to controlling operation of a power supply including one or more regulated power converter stages and one or more switched-capacitor converters, the concepts disclosed herein may be advantageously applied to any other suitable voltage converter topologies.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention (s), the reader is directed to the Detailed Description section (which is a summary of embodiments) and corresponding figures of the present disclosure as further discussed below.

BRIEF DESCRIPTION OF THE DRAWINGS

FIG. 16 is an example diagram illustrating fabrication of a regulated voltage converter on a circuit board according to embodiments herein.

Figure 1:
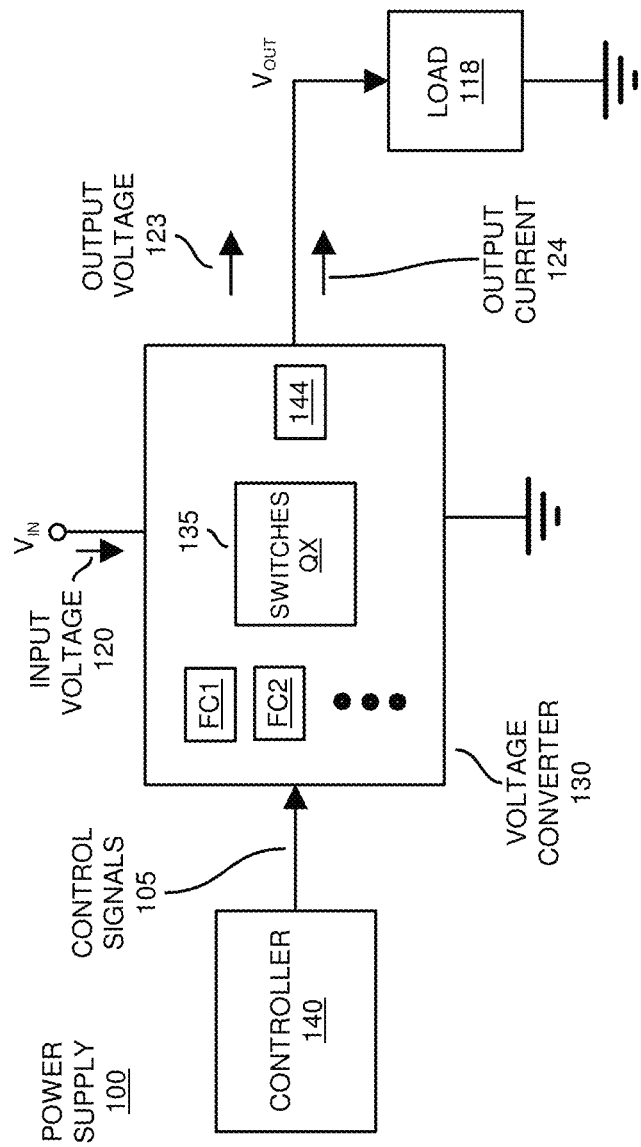
FIG. 1 is an example diagram illustrating a regulated voltage converter including multiple flying capacitors according to embodiments herein.

The foregoing and other objects, features, and advantages of embodiments herein will be apparent from the following more particular description herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

As previously discussed, embodiments herein are useful over conventional techniques. For example, in contrast to conventional techniques, the novel power supply as described herein provides high efficiency of converting an input voltage to a respective output voltage via unique regulation of energy received from multiple flying capacitors. More specifically, embodiments herein include a novel method, apparatus, system, etc., to balance generation of flying capacitor voltages and use of corresponding stored energy in a multi-level interleaved buck converter topology to produce an output voltage.

Now, more specifically, FIG. 1 is an example diagram illustrating a regulated voltage converter including multiple flying capacitors according to embodiments herein.

As shown in this example embodiment, power supply 100 includes a controller 140, voltage converter 130 (a.k.a., power converter), and load 118. Each of these components represents an entity such as an apparatus, electronic device, electronic circuitry, etc.

Note that each of the resources as described herein can be instantiated in any suitable manner. For example, the controller 140 can be instantiated as or include hardware (such as circuitry), software (executable instructions), or a combination of hardware and software resources where applicable.

In accordance with further example embodiments, the voltage converter 130 includes a first flying capacitor FC1, a second flying capacitor FC2, . . . , a network of switches 135 (such as including one or more switches Qx), and inductor 144.

During operation, the network of switches 135 controls conveyance of energy from the one or more flying capacitors (such as FC1, FC2, etc.) to the inductor 144. The flying capacitors are charged and discharged from one or more reference voltages such as input voltage 120, ground, etc., via switching of the network of switches 135 controlled by controller 140.

The inductor 144 converts the received energy from the flying capacitors FC1, FC2, etc., into an output voltage 123 to power a load 118.

In one embodiment, as discussed herein, the inductor 144 receives the energy as first current or first voltage from the first flying capacitor FC1, second current or second voltage from the second flying capacitor FC2, and so on. The inductor 144 also receives energy from the input voltage 120.

In further example embodiments, the controlled switching of the switches Qx (any number of switches) via generation of control signals 105 results in generation of a balanced voltage (such as substantially equal voltage) stored in each of the flying capacitors FC1, FC2, etc.

As further discussed below, further embodiments herein include, via the controller 140, implementing controlled switching of the network of switches 135 in accordance with multi-phase buck conversion of an input voltage 120 (such as a DC input voltage or quasi AC input voltage, etc.) into the output voltage 123 via the energy received from the multiple balanced flying capacitors.

Figure 2:
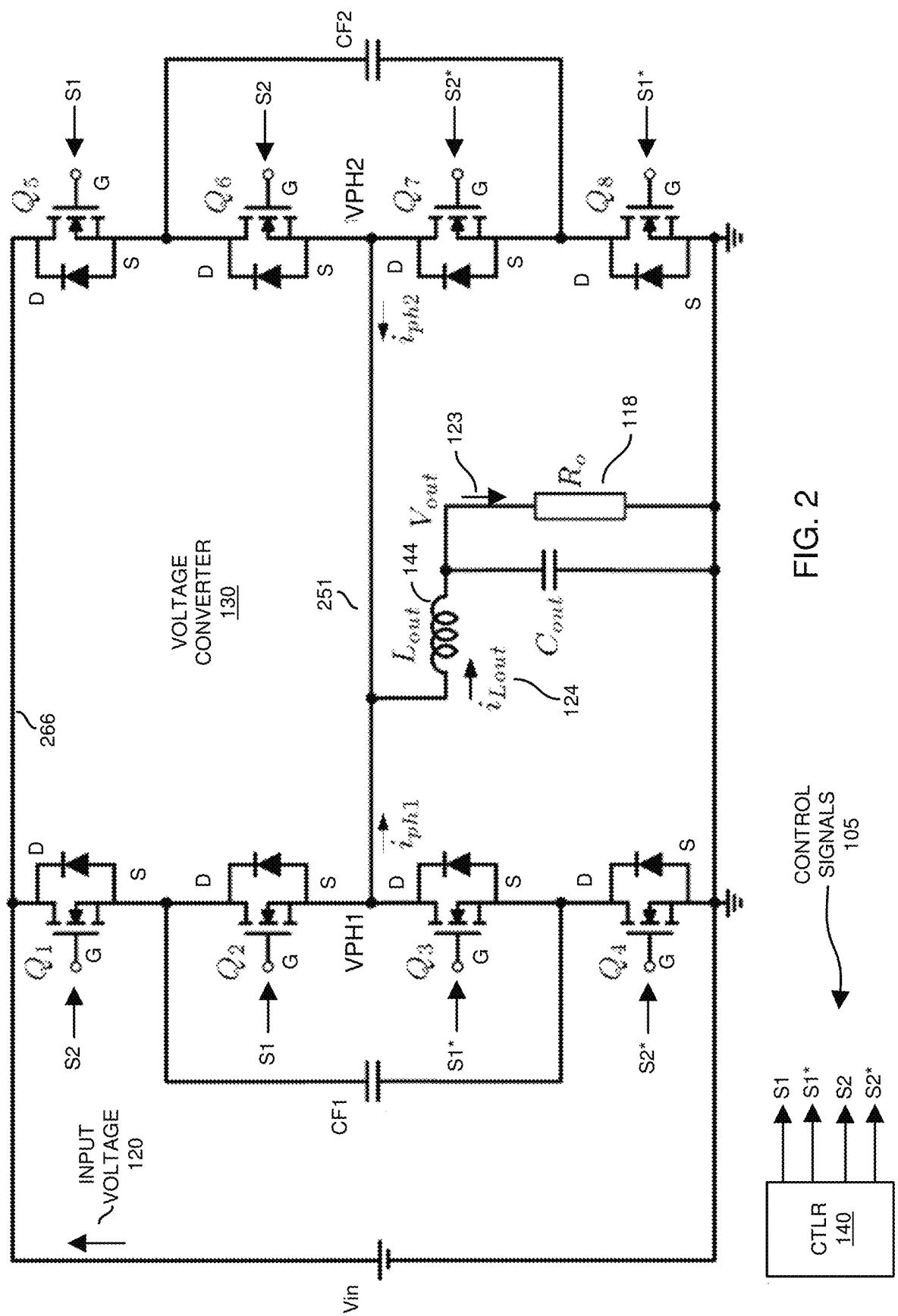
FIG. 2 is an example detailed diagram illustrating a regulated voltage converter including multiple flying capacitors according to embodiments herein.

FIG. 2 is an example detailed diagram illustrating a regulated voltage converter including multiple flying capacitors according to embodiments herein.

In this example embodiment, the voltage converter 130 in FIG. 2 includes network of switches 135 such as including switches Q1, Q2, Q3, Q4, Q5, Q6, Q7, and Q8. Voltage converter 130 also includes multiple flying capacitors such as flying capacitor FC1 (a.k.a., Cfly1), flying capacitor FC2 (a.k.a., Cfly2), etc. As previously discussed, voltage converter 130 also includes inductor 144 and capacitor Cout.

In this example embodiment, the switches Q1, Q2, Q3, and Q4 are connected in series between the input voltage node 266 (receiving input voltage 120) and the ground reference. For example, the drain node (D) of switch Q1 is connected to the input voltage source node; the source node (S) of switch Q1 is connected to the drain node (D) of switch Q2; the source node (S) of switch Q2 is connected to the drain node (D) of switch Q3; the source node (S) of switch Q3 is connected to the drain node (D) of switch Q4; the source node (S) of switch Q4 is connected to ground.

Controller 140 produces control signals S1 (a.k.a., Φa), S2 (a.k.a., Φb), S1* (a.k.a., Φa*), and S2* (a.k.a., Φb*), where S1* is the inversion of S1, where S2* is the inversion of S2.

As further shown, control signal S2 drives switch Q1; control signal S1 drives switch Q2; control signal S1* drives switch Q3; and control signal S2* drives switch Q4.

Further in this example embodiment, the switches Q5, Q6, Q7, and Q8 are connected in series between the input voltage node 266 and the ground reference. For example, the drain node (D) of switch Q5 is connected to the input voltage source node 266; the source node (S) of switch Q5 is connected to the drain node (D) of switch Q6; the source node (S) of switch Q6 is connected to the drain node (D) of switch Q7; the source node (S) of switch Q7 is connected to the drain node (D) of switch Q8; the source node (S) of switch Q8 is connected to ground.

As previously discussed, controller 140 produces control signals S1 (a.k.a., Φa), S2 (a.k.a., Φb), S1* (a.k.a., Φa*), and S2* (a.k.a., Φb*), where S1* is the inversion of S1, where S2* is the inversion of S2.

Control signal S1 drives switch Q5; control signal S2 drives switch Q6; control signal S2* drives switch Q7; and control signal S1* drives switch Q8.

Node 251 provides connectivity between the source node of switch Q2, the drain node of switch Q3, the source node of switch Q6, the drain node of switch Q7, and the inductor 144. The inductor 144 and capacitor Cout are connected in series between the node 251 and the ground reference of content 130.

Figure 3:
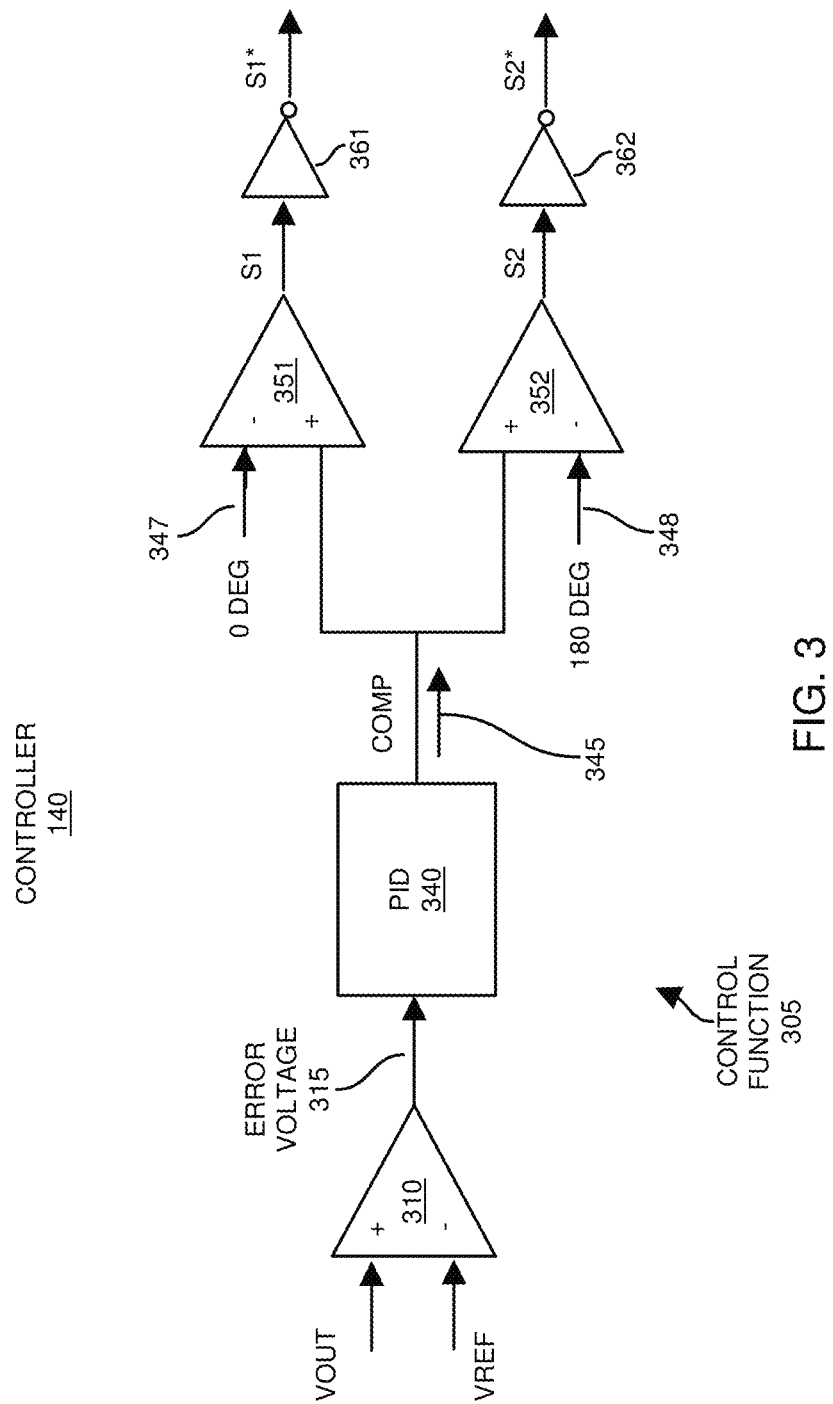
FIG. 3 is an example diagram illustrating a switch control signal generator according to embodiments herein.

In one embodiment, the voltage converter 130 in FIG. 2 is an example diagram illustrating a dual-phase three level flying capacitor (D-3LFC) buck converter, where two 3LFC buck converters have their phase node shorted and are controlled via respective control signals 105 in such way to be phase shifted by 180°. FIG. 3 illustrates a control circuit and generation of phase shifted control signals 105 such as control signals S1, S2, S1*, and S2*.

In this implementation of the voltage converter 130 of FIG. 2, the two phase nodes, v_ph1 and v_ph2, are in phase with each other. Therefore, they can be shorted together and connected to a common output inductor 144 to produce the output voltage 123. In one embodiment, as further discussed herein, the two 3LFC buck converter phases are controlled in such way that within a part of one switching cycle T_sw are connected in series with the input voltage and therefore their flying capacitor are naturally balanced to half of the input voltage 120 or other suitable value.

FIG. 3 is an example diagram illustrating a switch control signal generator according to embodiments herein.

In this example embodiment, the controller 140 includes amplifier 310, control function 340, comparator 351, compared to 352 inverter 361, and inverter 362.

During operation, the difference amplifier 310 produces the error voltage 315 based on a difference between the output voltage 120 with respect to a source reference setpoint voltage Vref. The control function 340 converts the received error voltage 315 into compensation signal 345 fed into the noninverting input of comparator 351 and the noninverting input of comparator 352. The ramp signal 347 is inputted to the noninverting input of comparator 351; the ramp signal 348 is inputted to the inverting input of comparator 352.

Comparator 351 produces control signal S1 whose duty cycle corresponds to a magnitude of the error voltage 315. Comparator 352 produces control signal S2 whose duty cycle corresponds to a magnitude of the error voltage 315.

In one embodiment, the control signal S1 and the control signal S2 are out of phase with respect to each other by 180 degrees, but are set to the same duty cycle value.

Thus, the controller 140 controls switches Q1-Q8 via signals S1, S2, S1*, and S2* to produce the output voltage 123. In one embodiment, the controller 140 determines the duty cycle of control signals S1, S2, etc., based on an error voltage 315 derived from comparing a magnitude of the output voltage 123 to a setpoint reference voltage (Vref). The duty cycle maintains a magnitude of the output voltage 123 at the setpoint reference voltage Vref.

Thus, as shown in FIG. 3, the controller 140 can be configured to operate in a voltage mode control.

Note further that the power converter and corresponding controller 140 can be configured to operate in any suitable feedback control mode. For example, the controller 140 can be implemented to operate in a current mode control based on the controller 140 monitoring output current 124 supplied by the output voltage 123 to the load 118 such as based on detected: peak current, average current, valley current, etc., of the output current 124. In such an instance, the controller 140 controls states (such as duty cycle, etc.) of the switches Q1-Q8 depending on a comparison of a monitored output current 124 to a current setpoint value. Thus, further embodiments herein include determining the duty cycle based on monitoring a magnitude of output current 124 supplied by the output voltage 123 to the load 118.

Figure 4:
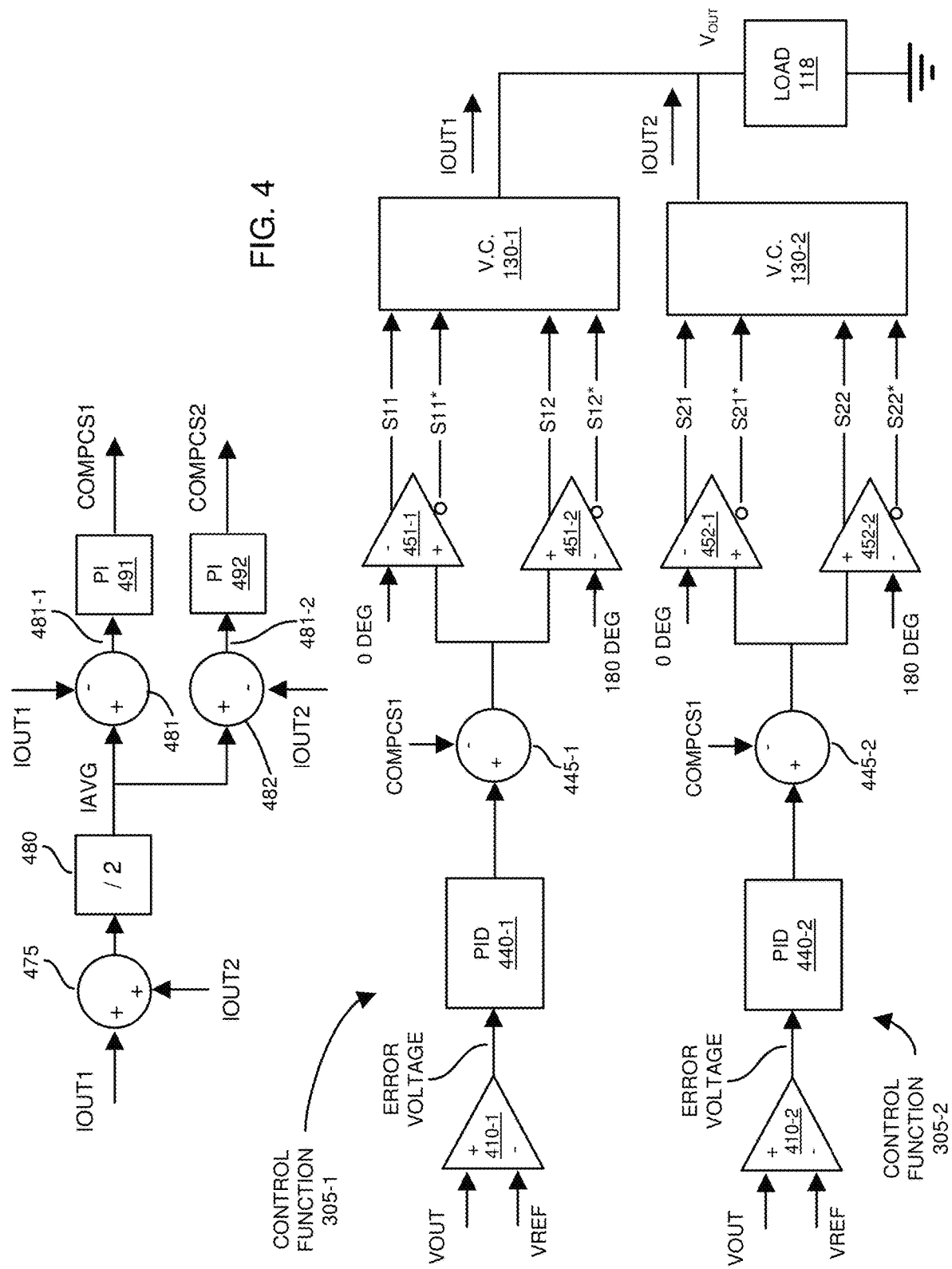
FIG. 4 is an example diagram illustrating a control signal generator according to embodiments herein.

FIG. 4 is an example diagram illustrating a control signal generator according to embodiments herein.

If high output power is required, multiple instances of the voltage converter (such as voltage converter 130-1, voltage converter 130-2, etc.) can be implemented to produce the output voltage 123. However, in such an instance, it may be desirable to implement a current sharing function as shown in FIG. 4 to balance current supplied by voltage converter 130-1 and voltage converter 130-2 to the load 118.

In one embodiment, the current sharing loop as discussed herein processes the current error of each phase and modulates the duty-cycle of each voltage converter in such a way as to achieve the same or substantially equal output current from each voltage converter.

More specifically, in this example embodiment, summer 475 adds a magnitude of the current Iout1 and Iout2. Divider 480 divides the sum by 2 to produce an average current value Iavg.

Difference function 481 produces error signal 481-1 indicating a difference between the average current Iavg and Iout1 supplied by the voltage converter 130-1 to the load 118. Difference function 482 produces error signal 482-1 indicating a difference between the average current Iavg and Iout2 supplied by the voltage converter 130-2 to the load 118.

Based on the error signal 481-1, the control function 491 (such as a PI controller, Proportional, Integral) produces the control signal COMPCS1. Based on the error signal 482-1, the control function 492 (such as a PI controller, Proportional, Integral) produces the control signal COMPCS2.

FIG. 4 further illustrates implementation of control function 305-1 and control function 305-2, each of which operates in a similar manner as previously discussed. The control signal COMPCS1 provides compensation to generation of the respective control signals that drive voltage converter 130-1; the control signal COMPCS2 provides compensation to generation of the respective control signals that drive voltage converter 130-2. In such an instance, the output current Iout1 from the voltage converter 130-1 is substantially equal to the output current Iout2 from voltage converter 130-2.

Figure 5:
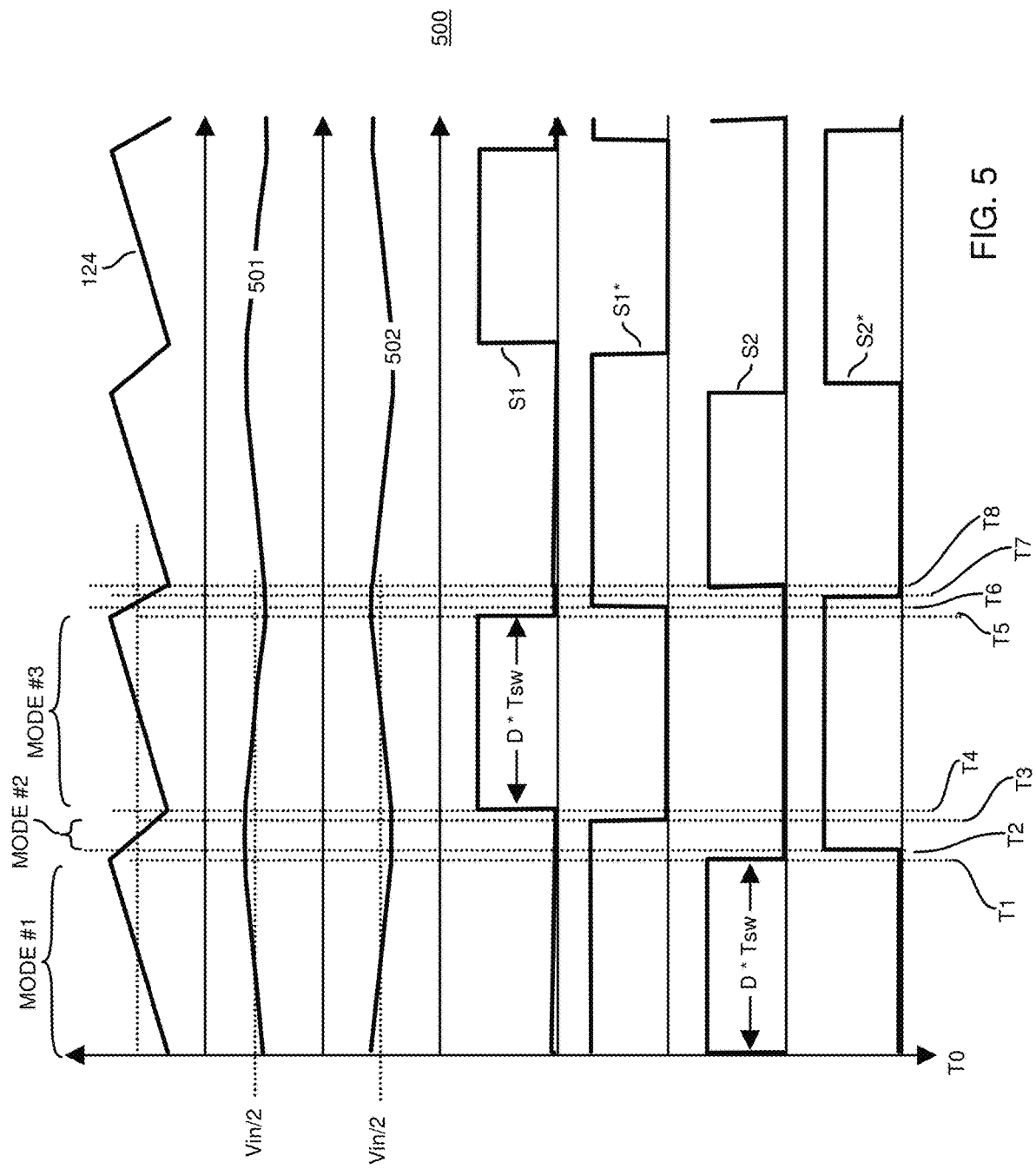
FIG. 5 is an example timing diagram illustrating control of multiple switches in a voltage converter according to embodiments herein.

FIG. 5 is an example timing diagram illustrating control of multiple switches in a voltage converter when duty cycle is less than 50% according to embodiments herein.

In one embodiment, during power conversion, the first flying capacitor CF1 stores a first voltage such as indicated by voltage 501; the second flying capacitor CF2 stores a second voltage 502. Switching operation of the network of switches 135 (such as switches Q1-Q8) controlled by control signals S1, S2, S1*, and S2* causes a magnitude of the first voltage 501 to be substantially equal to a magnitude of the second voltage 502 over time.

In one embodiment, the magnitude of the voltage 501 and the voltage 502 vary over time with respect to average voltage (input voltage Vin/2 threshold value). The conveyance of the energy from the first flying capacitor FC1 and the second flying capacitor FC2 to the inductor 144 over each of multiple control cycles of operating/controlling the network of switches 135 substantially equalizes a magnitude of the first voltage 501 to a magnitude of the second voltage 502.

More specifically, as shown in FIG. 5, the magnitude of the voltage 501 increases slightly between time T0 and T1; the magnitude of the voltage 502 decreases slightly between time T0 and T1. The magnitude of the voltage 501 decreases slightly between time T4 and T5; the magnitude of the voltage 502 increases slightly between time T4 and T5.

Thus, embodiments herein include an implementation of a respective voltage converter 130 that naturally equalizes a magnitude, over a single control cycle (between T0 and T8) and each of multiple other subsequent control cycles, of a first flying capacitor voltage 501 and a second flying capacitor voltage 502.

In accordance with yet further example embodiments, as previously discussed, the network of switches 135 includes first switches and second switches. The controller 140 produces the control signals to regulate a magnitude of the output voltage 123 via controlling the network of switches 135 using a same duty cycle. In other words, the time difference between time T0 and time T1 (duty cycle D time the switching period Tsw, where Tsw=time between T0 and T8) operating in mode #1 is equal to a time difference between time T4 and T5 (duty cycle, D, times the switching period Tsw, where Tsw=time between T0 and T8). As previously discussed, in one embodiment, the controller 140 determines the duty cycle D (ON time of signal S1 and ON-time of signal S2) based on an error voltage 315 derived from comparing a magnitude of the output voltage 123 to a setpoint reference voltage Vref (examples in FIG. 3 and FIG. 4).

In still further example embodiments, via generation of respective control signals, the controller 140 switches between multiple modes including one or more of: i) a first mode (mode #1 FIG. 6) in which the first flying capacitor FC1 and the second flying capacitor FC2 are connected in series between an input voltage 120 and ground reference (second voltage), the first flying capacitor FC1 is connected to the input voltage 120 while the second flying capacitor FC2 is connected to the ground reference, the inductor 144 is coupled to a node 251 coupling the first flying capacitor FC1 to the second flying capacitor FC2; ii) a second mode (mode #2 in FIG. 7) in which the node 251 of inductor 144 is coupled to ground, ii) a third mode (mode #3 in FIG. 8) in which the second flying capacitor FC2 and the first flying capacitor FC1 are connected in series between an input voltage 120 and ground, the second flying capacitor FC2 being connected to the input voltage 120 while the first flying capacitor FC1 is connected to the ground reference, node 251 of the inductor 144 couples the second flying capacitor FC2 to the first flying capacitor FC1.

Figure 6:
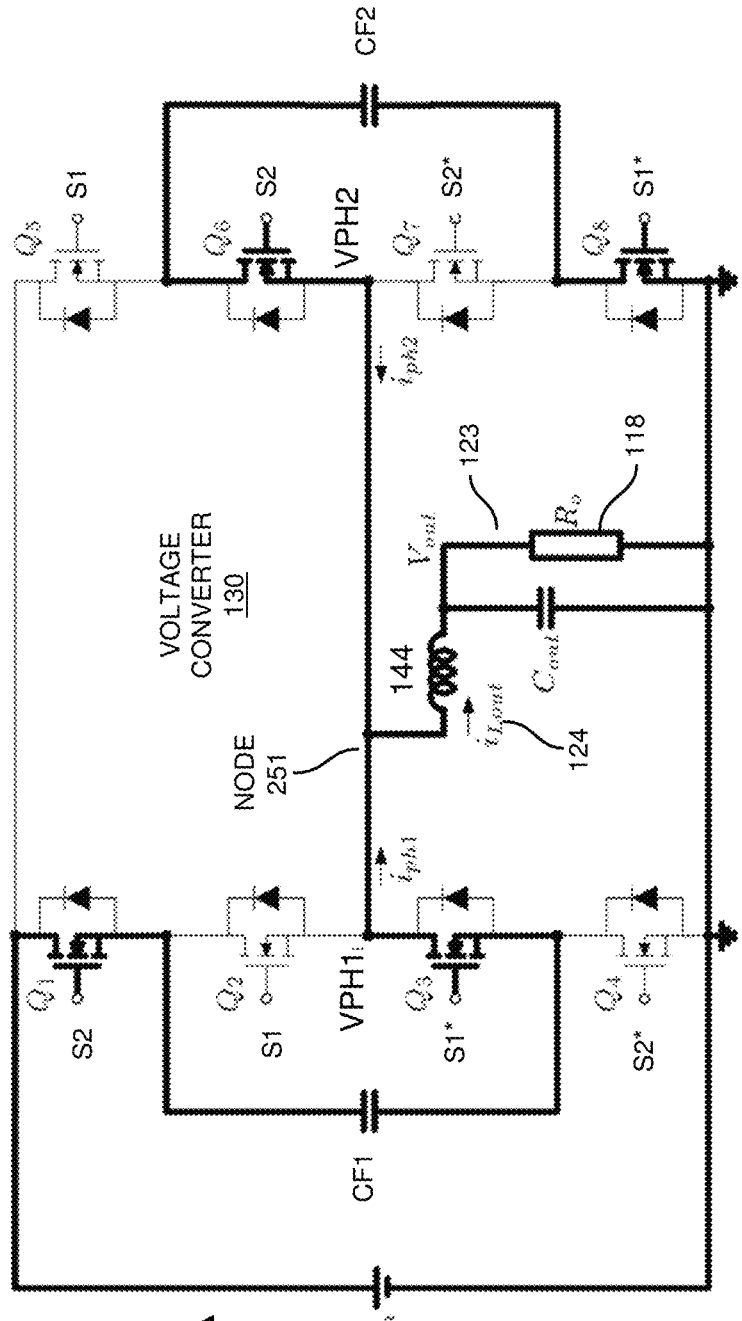
FIG. 6 is an example diagram illustrating operation of a regulated voltage converter in a first mode according to embodiments herein.

FIG. 6 is an example diagram illustrating operation of a regulated voltage converter in a first mode according to embodiments herein.

In still further embodiments, the network of switches 135 simultaneously supplies current iph1 from the first flying capacitor FC1 and current iph2 from the second flying capacitor FC2 to the inductor 144 that produces the output voltage 123.

Further embodiments herein include, via the network of switches 135, coupling the first flying capacitor FC1 and the second flying capacitor FC2 in series between a first reference voltage (input voltage 120) and a second reference voltage (ground). The inductor 144 receives the first current iph1 and the second current iph2 at a node 251 coupling the first flying capacitor FC1 to the second flying capacitor FC2.

Figure 7:
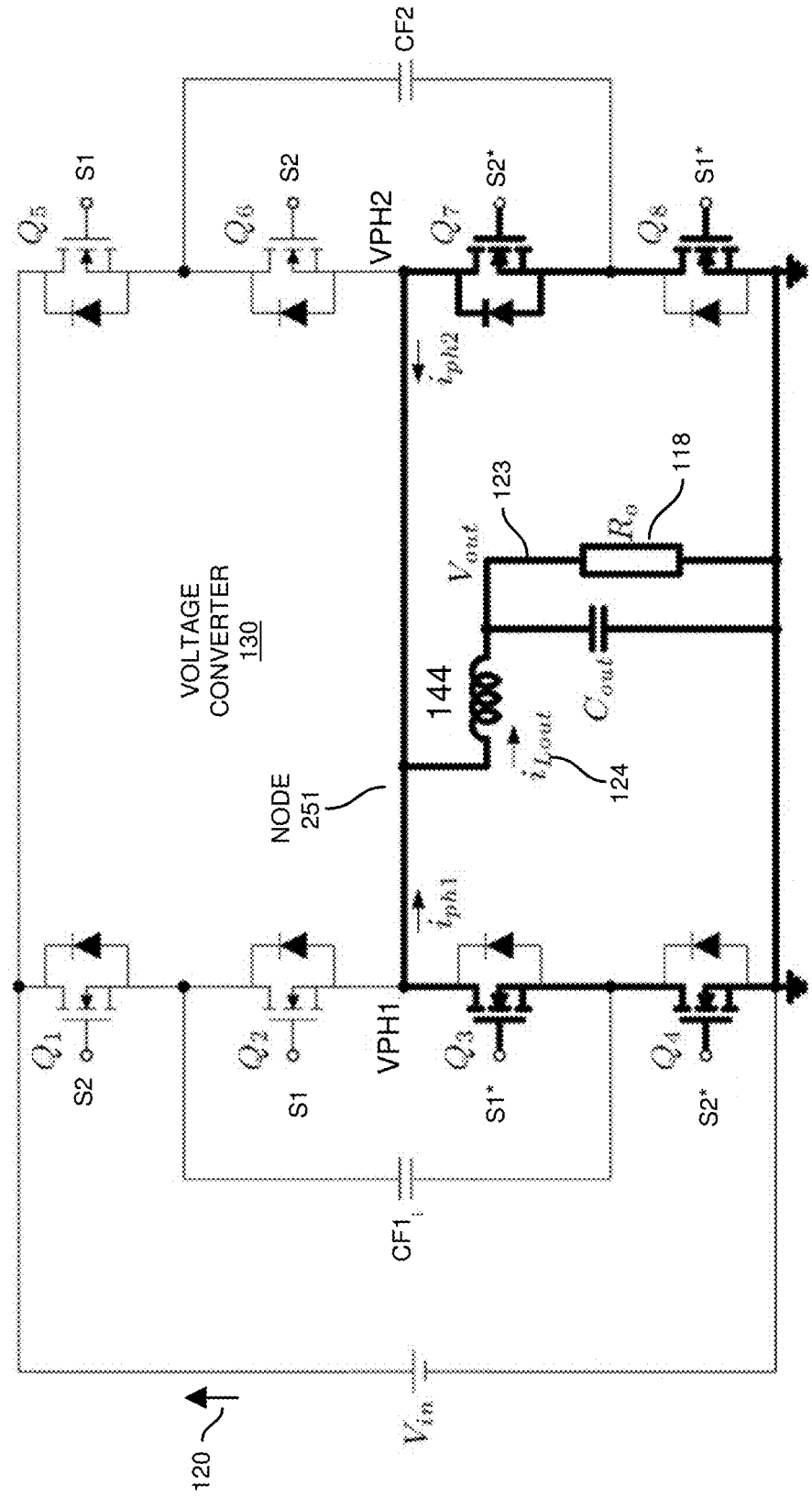
FIG. 7 is an example diagram illustrating operation of regulated voltage converter in a second mode according to embodiments herein.

FIG. 7 is an example diagram illustrating operation of regulated voltage converter in a second mode according to embodiments herein.

In this example embodiment, the controller 140 implements the second mode in which switches Q3, Q4, Q7, and Q8 are simultaneously activated. In such an instance, the ground reference supplies the current iph1 and current iph2 to the node 251 of the inductor 144.

Figure 8:
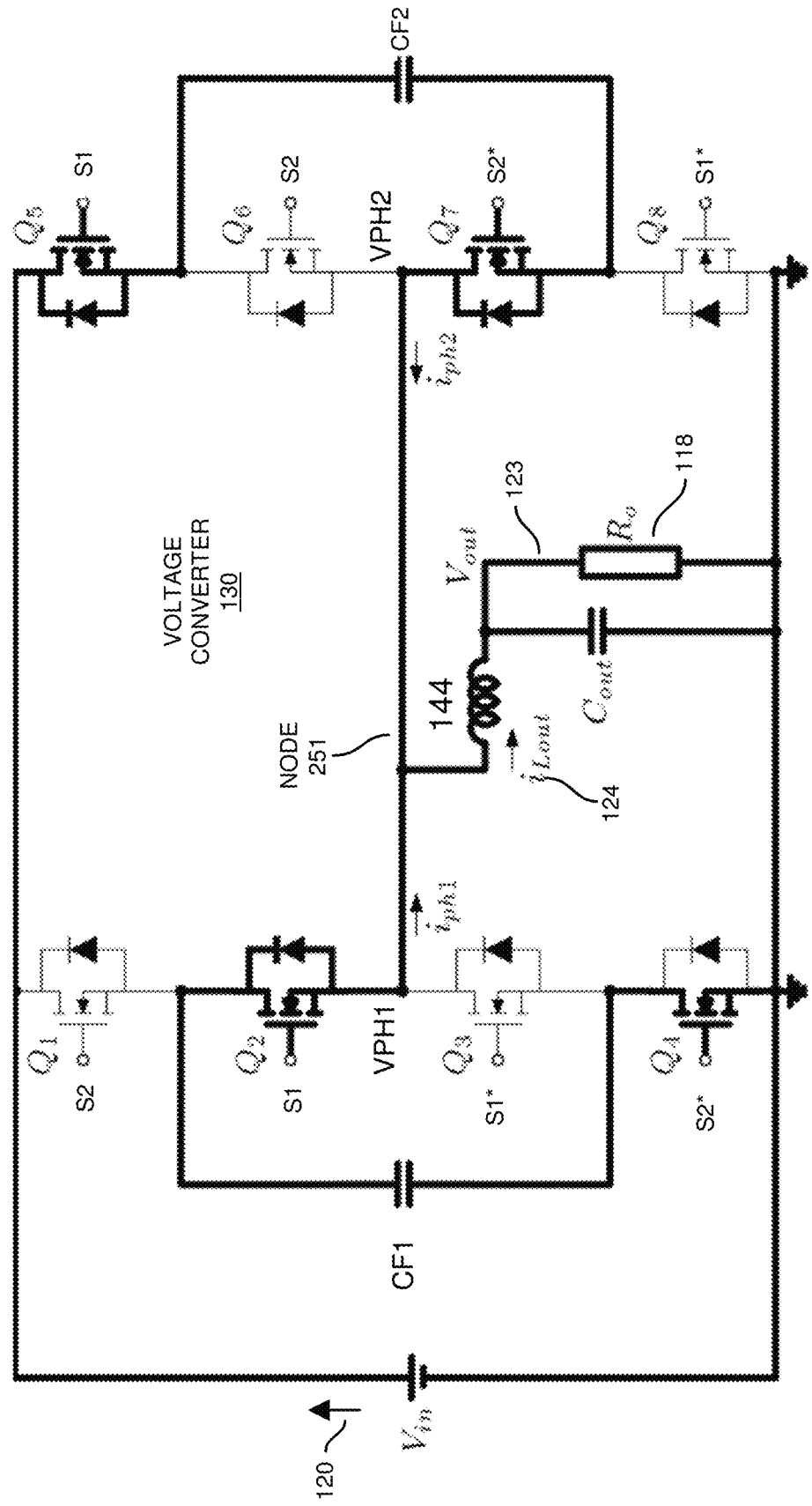
FIG. 8 is an example diagram illustrating operation of regulated voltage converter in a third mode according to embodiments herein.

FIG. 8 is an example diagram illustrating operation of regulated voltage converter in a third mode according to embodiments herein.

Now, with reference to a combination of FIGS. 5, 6, 7, and 8.
Operation Modes of Three-Level Flying Capacitor Buck Converter In this example embodiment, the controller 140 produces control signals as in timing diagram 500 of FIG. 5 based on conditions when the duty cycle is less than 50%.
1. Between $t_0$-$t_1$: (Mode #1), at $t=t_0$, the controller 140 activates switch $Q_1$ and $Q_6$ to an ON state. In mode #1, the flying capacitor $C_{fly1}$ (a.k.a., FC1) is charged from the input voltage 120 and is connected via switch $Q_3$ to the node phase $V_{ph1}$ powering the output inductance, whilst $C_{fly2}$ (a.k.a., FC2) is now discharging, powering the output inductance Lout. The corresponding state of switches for mode #1 is shown in FIG. 6. In this mode #1, the output inductor 144 is powered from $V_{in}$– $V_{fly1}$ and from $V_{fly2}$ respectively from the drain node of switch $Q_3$ and the source pin of $Q_6$. During this mode, the flying capacitors are naturally forced to balance to a value of $V_{in}/2$ since they are disposed in series between the input voltage 120 and the ground reference. However, the ripple on the flying capacitors (i.e., due to the load current (Ilout) from the inductor 144 and output capacitor Cout) leads for a reactive energy flowing between the two flying capacitors FC1 and FC2.
2. $t_1$-$t_2$: at $t=t_1$ Between T1 and T2 dead time, switches $Q_1$ and $Q_6$ are turned off
3. $t_2$-$t_3$: at $t=t_2$ (mode #2) after a dead-time period $T_{dead}$ from $t=t_1$, switch $Q_4$ and Q7 are turned ON. In this mode, the output inductor 144 (having inductance Lout) is discharged with a slope of Vout/Lout, where Vout is output voltage 123. The two flying capacitors $C_{fly1}$ (a.k.a., FC1) and $C_{fly2}$ (a.k.a., FC2) are maintained at a stable voltage level respectively $V_{Cfly1}(t_1)$ and $V_{Cfly2}(t_1)$. FIG. 7 shows a state of operating in mode #2.
4. $t_3$-$t_4$: at $t=t_3$ switch $Q_3$ and Qg are turned off.
5. $t_4$-$t_5$: (mode #3) at $t=t_4$ after a dead-time period $T_{dead}$ from $t=t_3$, the controller 140 activates switches $Q_2$ and $Q_5$ to an ON state. The flying capacitor $C_{fly2}$ (FC2) is charged from the input voltage 120 and is connected via switch $Q_7$ to the node phase $V_{ph2}$ powering the output inductor 144, whilst $C_{fly1}$ (FC1) is now discharging, powering the output inductance Lout. Operation in the mode #3 is shown in FIG. 8. In mode #3, the output inductor 144 is powered (receives energy) from $V_{in}$– $V_{fly1}$ and from $V_{fly2}$ respectively from the drain node of switch $Q_7$ and the source node of switch $Q_2$. During this mode, the flying capacitors are naturally forced to balance to a voltage level of $V_{in}/2$ since they are connected in series between the input voltage 120 and the ground reference voltage. However, the ripple on the flying capacitors (i.e. due to the load current and the output inductance) leads for a reactive energy flowing between the two flying capacitors.
6. $t_5$-$t_6$: at $t=t_5$ switch $Q_5$ and $Q_2$ are turned off.
7. $t_6$-$t_7$: at $t=t_6$ after a dead-time period $T_{dead}$ from $t=t_5$ switches $Q_8$ and $Q_3$ are turned on. In this mode (phase), the output inductor 144 is discharged with a slope of $V_{out}/L_{out}$. The two flying capacitors $C_{fly1}$ and $C_{fly2}$ are maintained at a stable voltage level respectively $V_{Cfly1}(t_5)$ and $V_{Cfly2}(t_5)$. The circuit state is now shown in FIG. 7.
8. $t_7$-$t_8$: at $t=t_7$ switch $Q_4$ and $Q_7$ are turned off. At $t=t_8$ switch $Q_1$ and $Q_6$ are turned on which correspond with one-cycle of the switching period $T_{sw}$.

Natural Balancing in Dual-Phase 3LFC Buck Converter

As previously discussed, due to the connection of the two midpoints of the 3L-FC legs, the flying capacitors FC1 and FC2 are connected in series during the subintervals t0-t1 (FIG. 6) and t4-t5 (FIG. 8). This forces the sum of the two flying capacitors voltages to be equal to Vin:

$$V_{in}=V_{Cfly1}+V_{Cfly2}$$

The difference between these two subintervals is that, in time range t0-t1, the capacitor Cfly2 (FC2) is at the bottom of the series connection while in t4-t5 Cfly1 (FC1) is at the bottom of the series connection. The value applied across the output inductor 144 during these two subintervals is equal to the voltage of the bottom capacitor minus the output voltage:

$V_{Lout} = V_{Cfly,bottom} - V_{out}$

The current ripple caused by the voltage mismatch of the two flying capacitors FC1 and FC2 is derived in the following paragraphs:

The voltage DeltaV can be calculated as:

$$\Delta V = \frac{|V_{Cfly1} - V_{Cfly2}|}{2}$$

The time-dependent behavior of the re-balancing process for an initial voltage mismatch of $\Delta V_{init}$ can be modeled as $$\Delta V(t) = \Delta V_{init} \cdot e^{-t/\tau}$$

The time-constant $\tau$ of the balancing depends on various system parameters and can be described with sufficient accuracy by:

$$\tau \approx \frac{f_{sw}}{f_{res}} \cdot \frac{\sqrt{L_{out} C_{fly}}}{2 R_{cond}} \cdot \frac{1}{D_{adj}}$$

Where the resistance Rcond is the lumped resistance of the conduction path of the bottom capacitor to the output, while the resonant frequency equals $$f_{res} = \frac{1}{2\pi \sqrt{L_{out} C_{fly}}}$$

The duty cycle D also impacts the balancing behavior since it defines for how much of the period the two flying capacitors are in the powering phase. The adjusted duty cycle $D_{adj}$ is calculated as follows:

$$D_{adj} = \begin{cases} 2 \cdot D, & D < 0.5 \\ 2 \cdot (1 - D), & D \geq 0.5 \end{cases}$$

Figure 9:
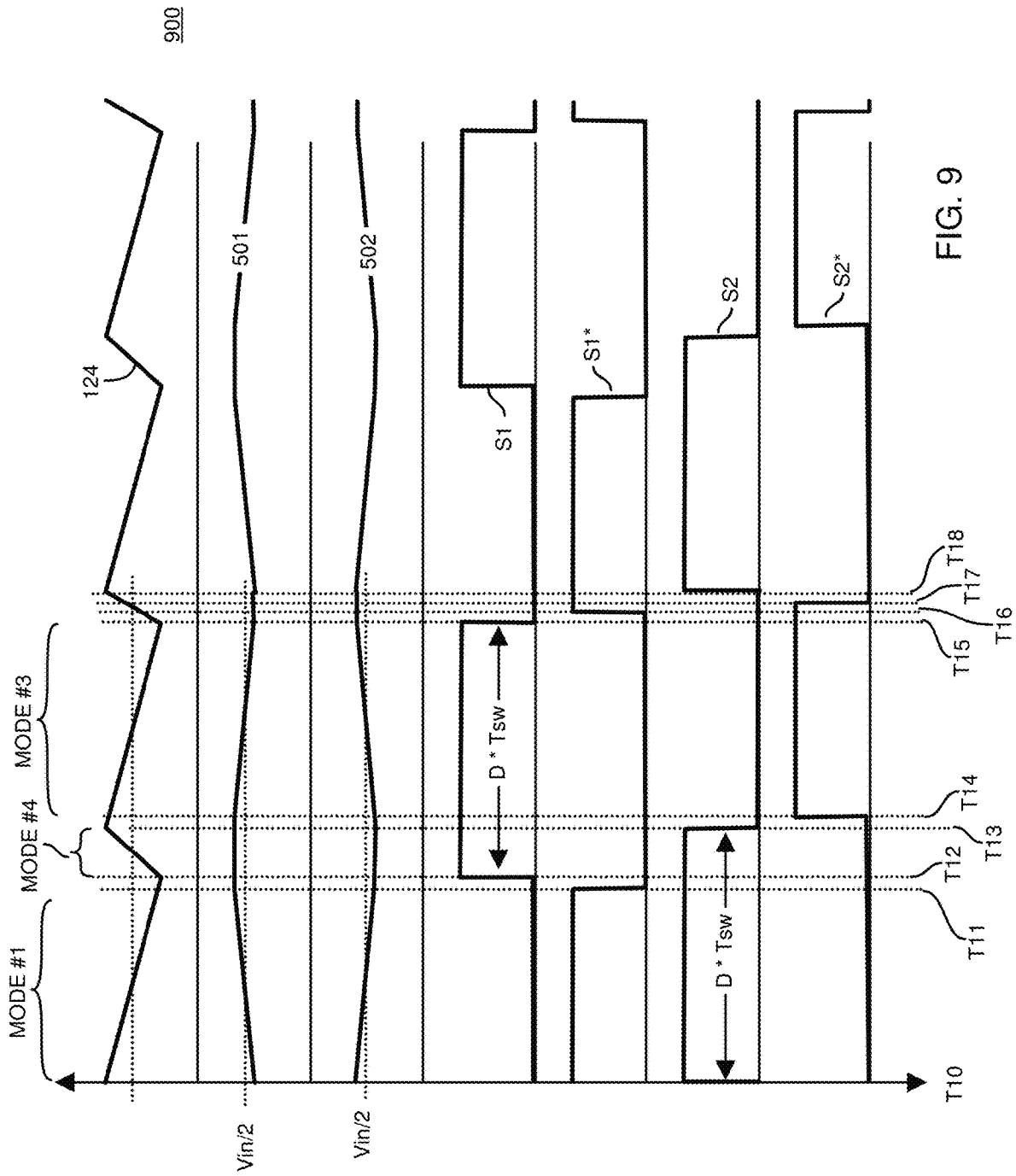
FIG. 9 is an example timing diagram illustrating control of multiple switches in a voltage converter according to embodiments herein.

FIG. 9 is an example timing diagram illustrating control of multiple switches in a voltage converter according to embodiments herein.

In this example embodiment, the controller 140 controls the duty cycle of operating switches to be greater than 50%. The controller 140 switches between multiple modes including one or more of: i) a first mode (mode #1 as in FIG. 6) in which the first flying capacitor FC1 and the second flying capacitor FC2 are connected in series between the input voltage 120 and ground, the first flying capacitor FC1 being connected to the input voltage 120 while the second flying capacitor FC2 is connected to the ground reference, the inductor 144 is connected to node 251 coupled to the first flying capacitor FC1 to the second flying capacitor FC2; ii) a fourth mode (mode #4 such as in FIG. 10) in which the inductor 144 is coupled to receive the input voltage 121 through activated switches Q1, Q2, Q5, and Q6, ii) a third mode (mode #3 such as in FIG. 8) in which the second flying capacitor FC2 and the first flying capacitor FC1 are connected in series between the input voltage 120 and ground reference, the second flying capacitor FC2 is connected to the input voltage 120 while the first flying capacitor FC1 is connected to the ground reference, the inductor 144 coupled to node 251 connects the second flying capacitor FC2 to the first flying capacitor FC1.

Over time, note that the consumption of output current 124 consumed by the load 118 varies. As previously discussed, the duty cycle D of controlling respective network of switches 135 varies to accommodate the different amounts of current consumption by the load 118. Embodiments herein include implementing one or more of the 4 modes such as mode #1, mode #2, mode #3, and mode #4 as previously discussed to maintain a magnitude of the output voltage 123 within a desired voltage range such as the setpoint reference voltage Vref+/−1% or other suitable value.

Figure 10:
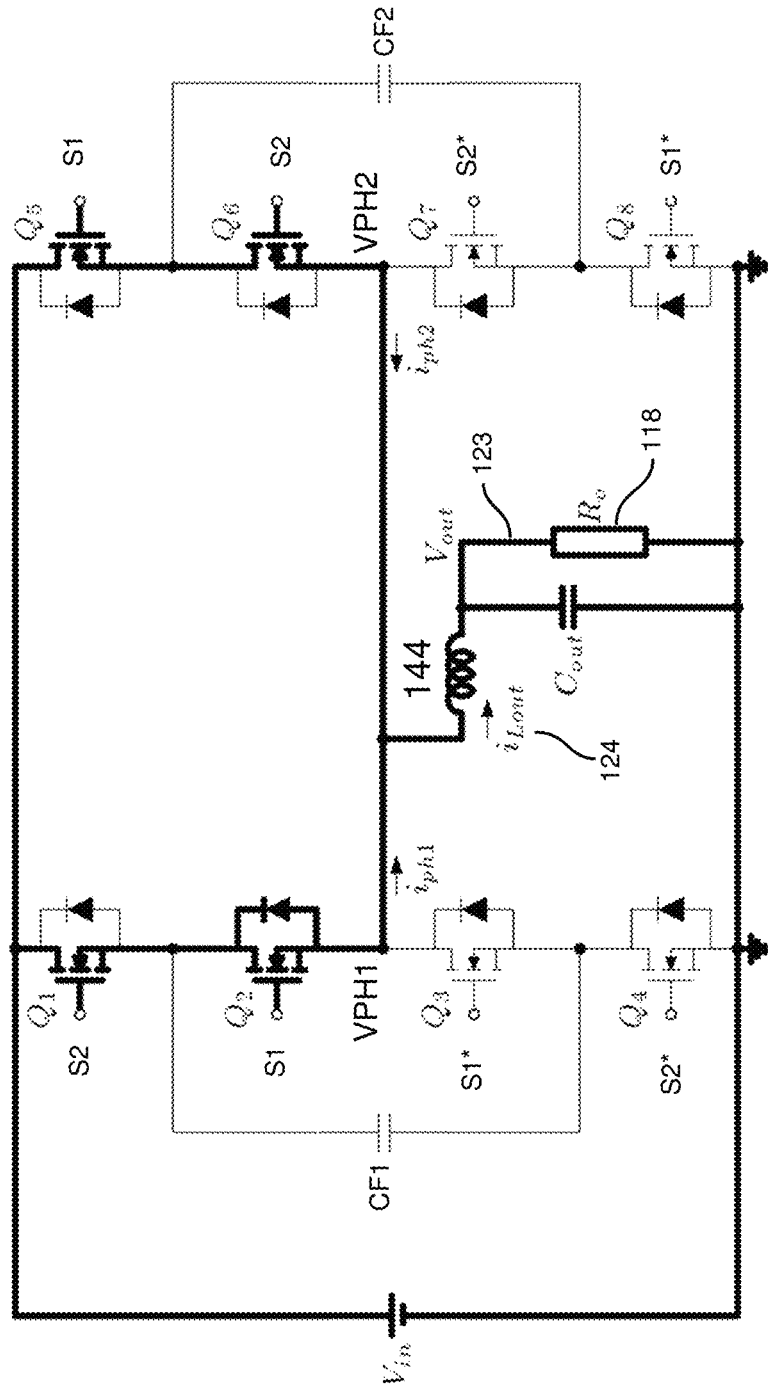
FIG. 10 is an example diagram illustrating operation of a regulated voltage converter in a fourth mode according to embodiments herein.

FIG. 10 is an example diagram illustrating operation of a regulated voltage converter in a fourth mode according to embodiments herein.

As previously discussed, FIG. 10 illustrates activation of switches Q1, Q2, Q5, and Q6 during mode #4. This connects the input voltage 120 to the inductor 144 via a respective low impedance switch path, resulting in an increase in a magnitude of the output current 124 through inductor 144 to the load 118.

Figure 11:
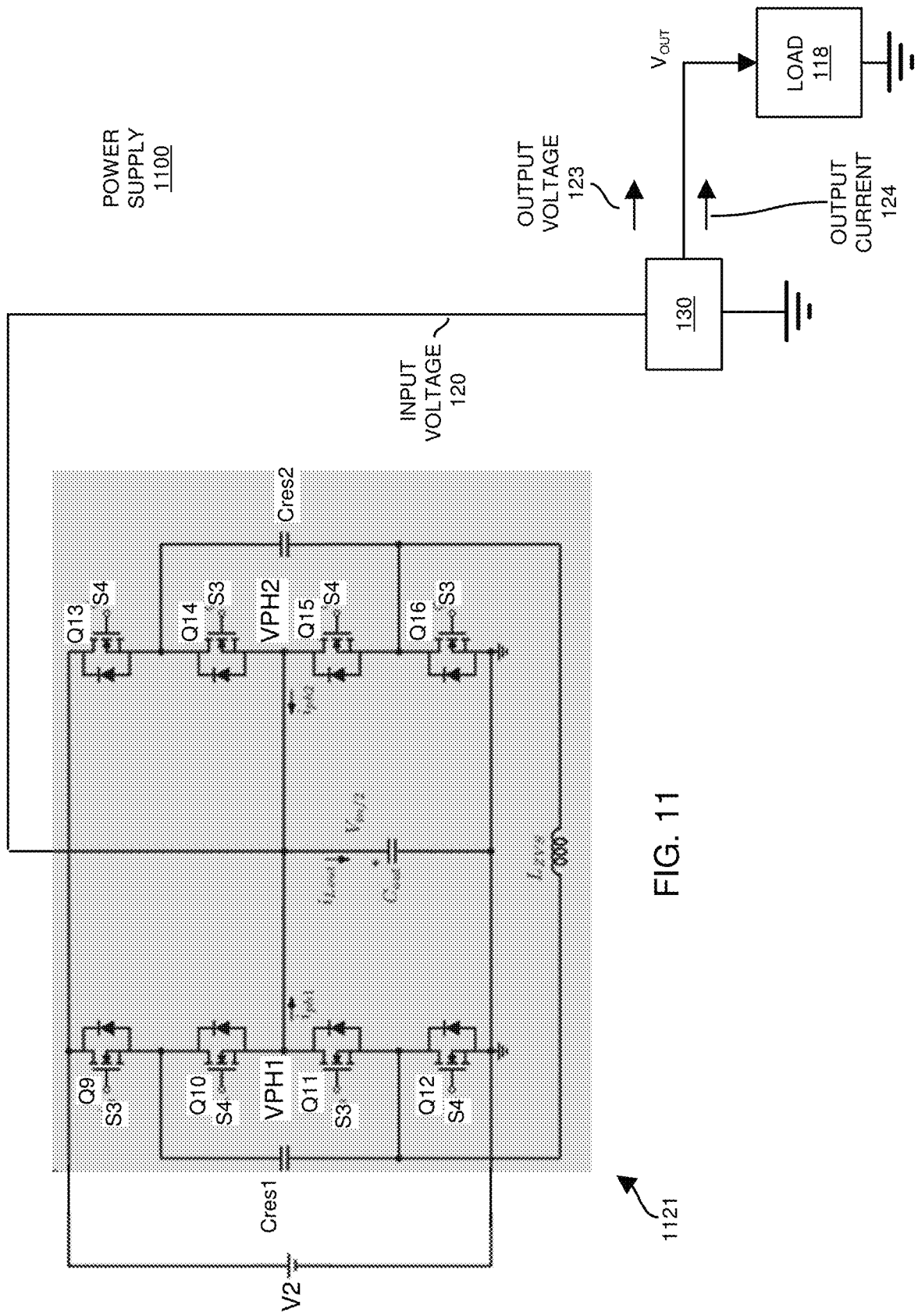
FIG. 11 is an example diagram illustrating a multi-stage regulated voltage converter according to embodiments herein.

FIG. 11 is an example diagram illustrating a multi-stage regulated voltage converter according to embodiments herein.

In this example embodiment, the power supply 1100 includes voltage converter 1121 and voltage converter 130. Voltage converter 1121 receives the input voltage V2 and converts it into input voltage 120 supplied to the voltage converter 130.

In a manner as previously discussed, the voltage converter 130 converts the input voltage 120 into the output voltage 123 that powers the dynamic load 118.

Thus, power supply 1100 is an application implementing a dual phase 3LFC in a two-stage approach.

In one embodiment, the voltage converter 1121 is a first power converter stage such as a 2:1 zero-voltage switching switched capacitor. The first stage voltage converter 1121 supplies the input voltage 120 to the second stage power converter such as voltage converter 130 (a.k.a., a dual-phase 3LFC).

In one nonlimiting example embodiment, the voltage converter 130 provides good performance in terms of transient response and power density when the output voltage 123 is half of the input voltage 120 (i.e., the current ripple on the output inductance is low), reducing the current stress on the voltage converter 130 (such as second stage 3LFC). In one embodiment, the control strategy requires only a duty-cycle control scheme enabling the use of commercial analog or digital controller.

Thus, the voltage converter 1121 can be configured to convert an input voltage V2 (such as 48 VDC) into the input voltage 120 such as 24 VDC. The voltage converter 130 converts the input voltage 120 into an output voltage 123 such as a 12 VDC or other suitable value.

Figure 12:
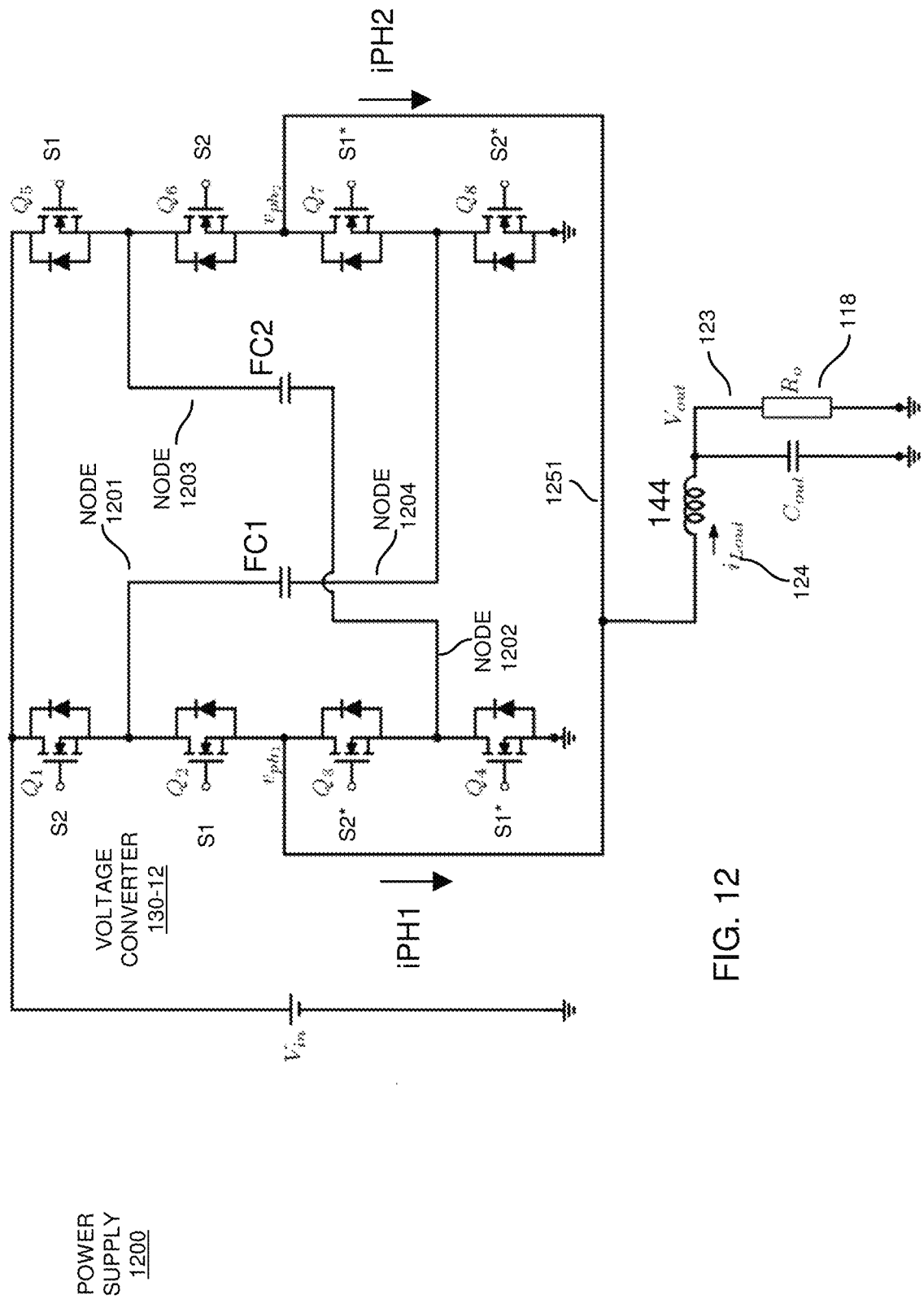
FIG. 12 is an example diagram illustrating a regulated voltage converter including cross connected flying capacitors according to embodiments herein.

FIG. 12 is an example diagram illustrating a regulated voltage converter including cross connected flying capacitors according to embodiments herein.

In this embodiment, the voltage converter 130 (such as a dual-phase 3LFC buck converter) is implemented with cross connection of the flying capacitors. For example, the voltage converter 130-12 in FIG. 12 includes a common phase node having flying capacitor cross-connected.

In this example embodiment, the voltage converter 130-12 in FIG. 12 includes network of switches 135 such as including switches Q1, Q2, Q3, Q4, Q5, Q6, Q7, and Q8. Voltage converter 130-12 also includes multiple flying capacitors such as flying capacitor FC1 (a.k.a., Cfly1), flying capacitor FC2 (a.k.a., Cfly2), etc. As previously discussed, voltage converter 130-12 also includes inductor 144 and capacitor Cout.

In this example embodiment, the switches Q1, Q2, Q3, and Q4 are connected in series between the input voltage node and the ground reference. For example, the drain node (D) of switch Q1 is connected to the input voltage source node; the source node (S) of switch Q1 is connected to the drain node (D) of switch Q2 at node 1201; the source node (S) of switch Q2 is connected to the drain node (D) of switch Q3; the source node (S) of switch Q3 is connected to the drain node (D) of switch Q4 at node 1202; the source node (S) of switch Q4 is connected to ground.

Controller 140 produces control signals S1 (a.k.a., Φa), S2 (a.k.a., Φb), S1* (a.k.a., Φa*), and S2* (a.k.a., Φb*), where S1* is the inversion of S1, where S2* is the inversion of S2. Control signal S2 drives switch Q1; control signal S1 drives switch Q2; control signal S2* drives switch Q3; and control signal S1* drives switch Q4.

Further in this example embodiment, the switches Q5, Q6, Q7, and Q8 are connected in series between the input voltage node and the ground reference. For example, the drain node (D) of switch Q5 is connected to the input voltage source node; the source node (S) of switch Q5 is connected to the drain node (D) of switch Q6 at node 1203; the source node (S) of switch Q6 is connected to the drain node (D) of switch Q7; the source node (S) of switch Q7 is connected to the drain node (D) of switch Q8 at node 1204; the source node (S) of switch Q8 is connected to ground.

As previously discussed, controller 140 produces control signals S1 (a.k.a., Φa), S2 (a.k.a., Φb), S1* (a.k.a., Φa*), and S2* (a.k.a., Φb*), where S1* is the inversion of S1, where S2* is the inversion of S2. Control signal S1 drives switch Q5; control signal S2 drives switch Q6; control signal S1* drives switch Q7; and control signal S2* drives switch Q8.

Flying capacitor CF1 is coupled between nodes 1201 and 1204. Flying capacitor CF2 is coupled between nodes 1202 and 1203.

Node 1251 provides connectivity between the source node of switch Q2, the drain node of switch Q3, the source node of switch Q6, the drain node of switch Q7, and the inductor 144. The inductor 144 and capacitor Cout are connected in series between the node 1251 and the ground reference of the voltage converter 130-12.

Such a circuit shown in FIG. 12 can be a useful alternative to the voltage converter 130 illustrated in FIG. 2. For example, the cross connect embodiment in FIG. 12 helps to reduce mismatch between the two multi-level half bridge circuits in the dual-phase 3LFC buck converter. The PWM control applied to the voltage converter 130-12 in FIG. 12 is shown in FIG. 5. As further discussed below, the 3LFC-DF is a primitive of an N level voltage converter implementation.

Figure 13:
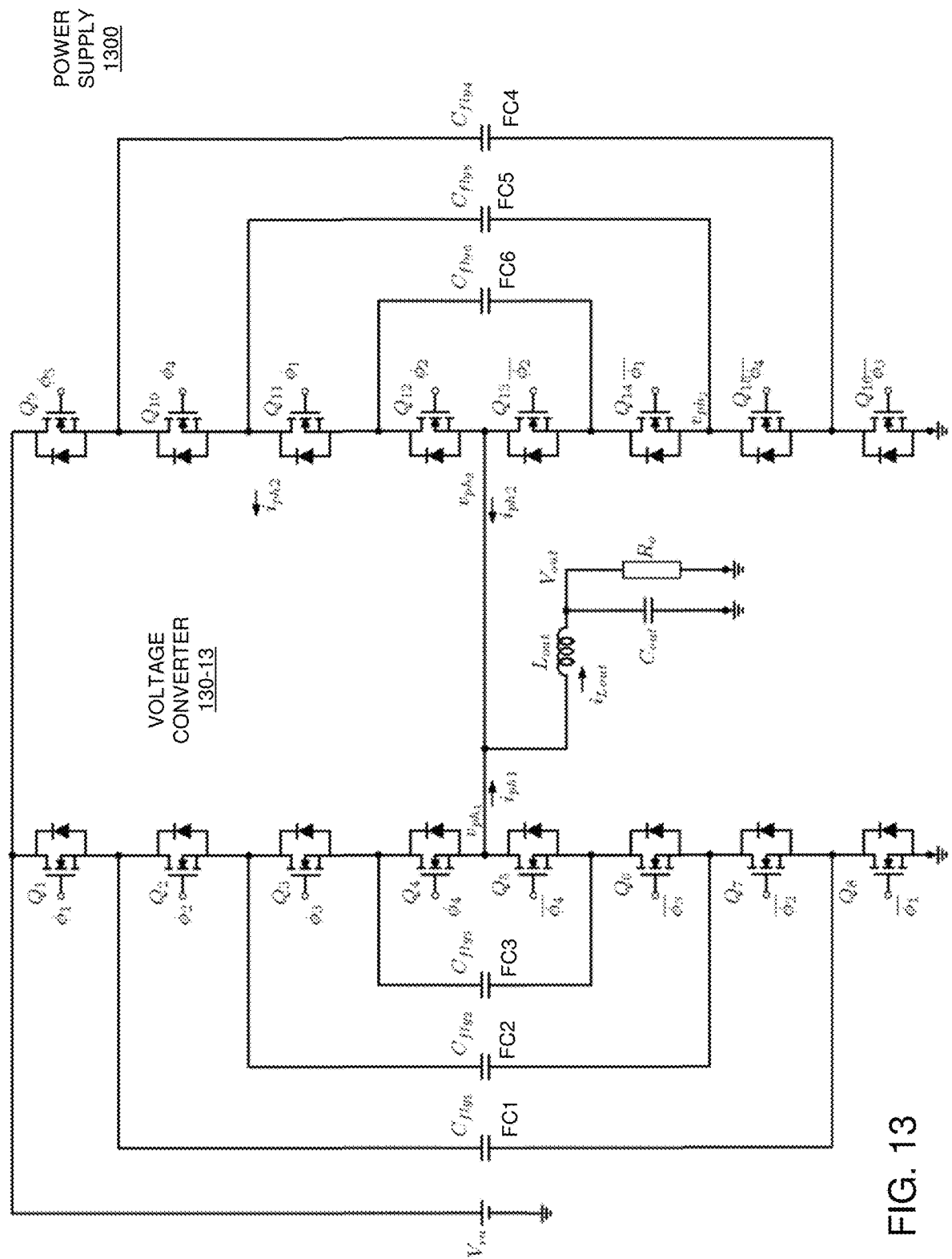
FIG. 13 is an example diagram illustrating a dual phase multi-level flying capacitor buck converter according to embodiments herein.

FIG. 13 is an example diagram illustrating a dual phase multi-level flying capacitor buck converter according to embodiments herein.

A similar approach as previously discussed for the voltage converter 130 can be expanded to include any number of N levels of flying capacitor buck converters, where N is an integer value greater than 1.

In this example embodiment of implementing an N=3 (i.e., 3 level) flying capacitor power converter, the switches Q1-Q8 are connected in series between the input voltage node and the ground reference. Similarly, the switches Q9-Q16 are connected in series between the input voltage node and the ground reference.

Flying capacitors CF1, CF2, . . . CF6 are connected between pairs of the series switches. For example, the flying capacitor FC3 is connected in parallel with series connection of switches Q4 and Q5; the flying capacitor FC2 is connected in parallel with series connection of switches Q3 to Q6; the flying capacitor FC1 is connected in parallel with series connection of switches Q2 through Q7.

The flying capacitor FC6 is connected in parallel with series connection of switches Q12 and Q13; the flying capacitor FC5 is connected in parallel with series connection of switches Q11 to Q14; the flying capacitor FC4 is connected in parallel with series connection of switches Q10 and Q15.

In a similar manner as previously discussed, each of the legs supplies current through inductor Lout to produce the output voltage 123 (Vout).

The voltage converter 130-13 in FIG. 13 illustrates an example implementation having a 5 level flying capacitor (5LFC) buck converters. In the voltage converter 130-13, the flying capacitor voltage C_fly2 (FC2) and C_fly5 (FC5) are kept to half of the input voltage V_in.

Moreover, the average voltage across C_fly1 (CF1) and C_fly4 (CF4) will be maintained as substantially equal to the voltage across C_fly3 (CF3) and C_fly6 CF6).

In one embodiment, in order to control the system in a such way to balance the flying capacitor voltages of the two phases N levels flying capacitors (NLFC) connected to the same phase node, these two corresponding NLFC are controlled as 180° phase shifted signals, similar to the control of the voltage converter 130 in FIG. 2.

Figure 14:
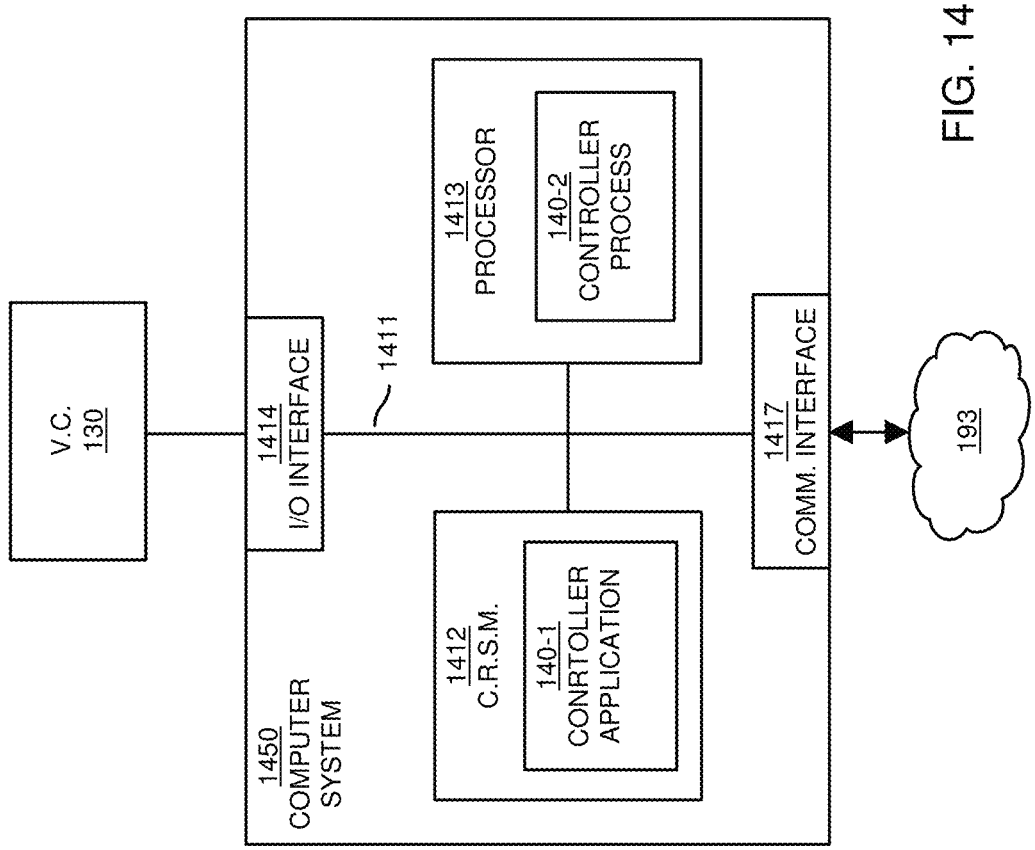
FIG. 14 is an example diagram illustrating computer architecture operable to execute one or more operations according to embodiments herein.

FIG. 14 is an example block diagram of a computer system for implementing any of the operations as previously discussed according to embodiments herein.

Any of the resources (such as controller 140, etc.) as discussed herein can be configured to include computer processor hardware and/or corresponding executable instructions to carry out the different operations as discussed herein.

As shown, computer system 1450 of the present example includes an interconnect 1411 that couples computer readable storage media 1412 such as a non-transitory type of media (which can be any suitable type of hardware storage medium in which digital information can be stored and retrieved), a processor 1413 (computer processor hardware), I/O interface 1414, and a communications interface 1417.

I/O interface(s) 1414 supports connectivity to repository 1480 and input resource 1492.

Computer readable storage medium 1412 can be any hardware storage device such as memory, optical storage, hard drive, floppy disk, etc. In one embodiment, the computer readable storage medium 1412 stores instructions and/or data.

As shown, computer readable storage media 1412 can be encoded with controller application 140-1 (e.g., including instructions) to carry out any of the operations as discussed herein.

During operation of one embodiment, processor 1413 accesses computer readable storage media 1412 via the use of interconnect 1411 in order to launch, run, execute, interpret or otherwise perform the instructions in controller application 140-1 stored on computer readable storage medium 1412. Execution of the controller application 140-1 produces controller process 140-2 to carry out any of the operations and/or processes as discussed herein.

Those skilled in the art will understand that the computer system 1450 can include other processes and/or software and hardware components, such as an operating system that controls allocation and use of hardware resources to execute controller application 140-1.

In accordance with different embodiments, note that computer system may reside in any of various types of devices, including, but not limited to, a power supply, switched-capacitor converter, power converter, a mobile computer, a personal computer system, a wireless device, a wireless access point, a base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, set-top box, content management device, handheld remote control device, any type of computing or electronic device, etc. The computer system 1450 may reside at any location or can be included in any suitable resource in any network environment to implement functionality as discussed herein.

Functionality supported by the different resources will now be discussed via flowchart in FIG. 15. Note that the steps in the flowcharts below can be executed in any suitable order.

Figure 15:
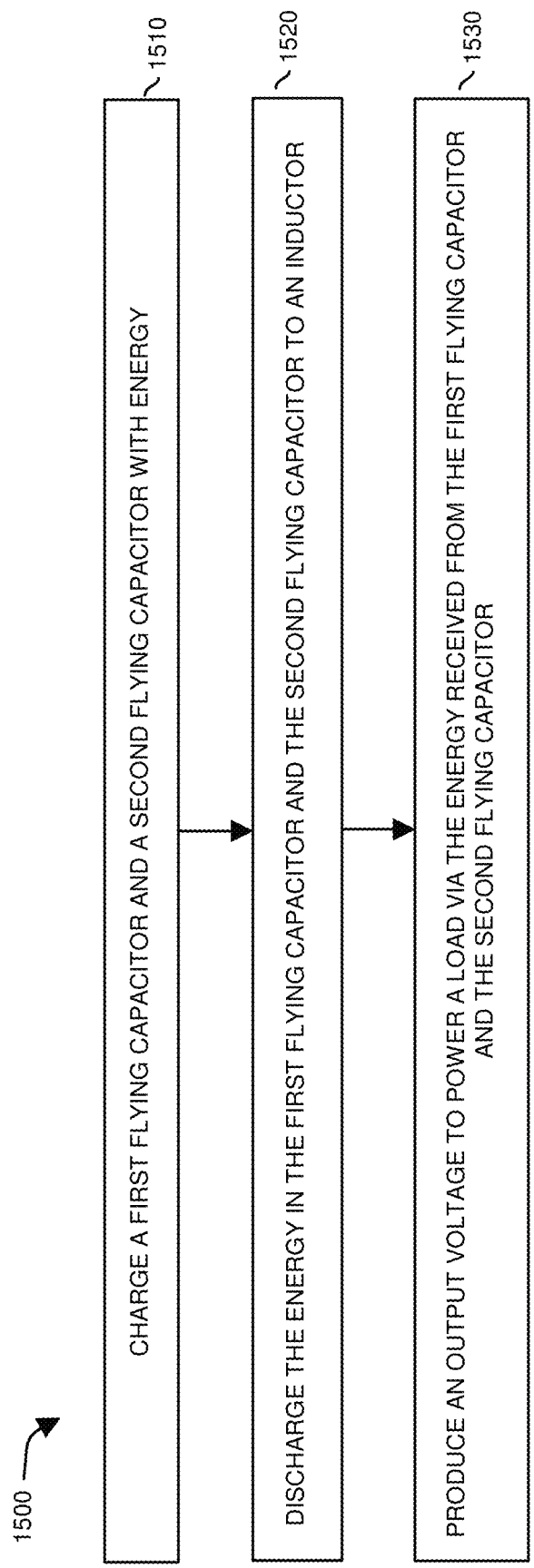
FIG. 15 is an example diagram illustrating a general method according to embodiments herein.

FIG. 15 is a flowchart 1500 illustrating an example method according to embodiments herein. Note that there will be some overlap with respect to concepts as discussed above.

In processing operation 1510, the controller 140 controls the network of switch 135 of voltage converter 130 to charge a first flying capacitor FC1 and a second flying capacitor FC2 with energy.

In processing operation 1520, the controller 140 controls the network of switches 135 to discharge the energy in the first flying capacitor FC1 and the second flying capacitor FC2 to an inductor 144.

In processing operation 1530, the controller 140 produces an output voltage 123 to power load 118 via the energy received from the first flying capacitor FC1 and the second flying capacitor FC2.

FIG. 16 is an example diagram illustrating fabrication of a power converter circuit on a circuit board according to embodiments herein.

In this example embodiment, fabricator 1640 receives a substrate 1610 (such as a circuit board).

The fabricator 1640 further affixes the power supply 100 (and corresponding components as previously discussed) to the substrate 1610. Via circuit paths 1622 (such as one or more traces, cables, wires, etc.), the fabricator 1640 couples the voltage converter 130 of power supply 100 to load 118. In one embodiment, the circuit paths 1621 convey the output voltage 123 to the load 118.

Accordingly, embodiments herein include a system comprising: a substrate 1610 (such as a circuit board, standalone board, mother board, standalone board destined to be coupled to a mother board, etc.); a power supply 100 including corresponding components (such as voltage converter 130 and corresponding components) as described herein; and a load 118. As previously discussed, the load 118 is powered based on conveyance of output voltage 123 over one or more circuit paths 1622 from the voltage converter 130 to the load 118.

Note that further embodiments herein include a system (as shown in FIG. 16) comprising: the circuit substrate 1610 and the load 118 disposed on the substrate 1610. The power supply 100 (apparatus) is affixed to the circuit substrate 1610 and powers the load 118 via the output voltage 123 (such as via one or more circuit paths 1622).

Note that the load 118 can be any suitable circuit or hardware such as one or more CPUs (Central Processing Units), GPUs (Graphics Processing Unit) and ASICs (Application Specific Integrated Circuits such those including one or more Artificial Intelligence Accelerators), which can be located on the substrate 1610 or disposed at a remote location.

Note again that techniques herein are well suited for use in power supply applications. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An apparatus comprising:
a first flying capacitor;
a second flying capacitor;
an inductor;
a network of switches operative to control conveyance of energy from the first flying capacitor and the second flying capacitor to the inductor, the inductor operative to produce an output voltage to power a load from the conveyed energy:
wherein the first flying capacitor is operative to store a first voltage and the second flying capacitor is operative to store a second voltage;
wherein regulation of a magnitude of the output voltage with respect to a setpoint reference voltage via switching of the network of switches is operative to equalize a magnitude of the first voltage and a magnitude of the second voltage;
wherein the network of switches includes: i) a first series connection of switches between an input voltage source and a reference voltage node, and ii) a second series connection of switches between the input voltage source and the reference voltage node;
wherein the first flying capacitor is connected between a first node of the first series connection and a first node of the second series connection; and
wherein the second flying capacitor is connected between a second node of the first series connection and a second node of the second series connection.

2. The apparatus as in claim 1,
wherein conveyance of the energy from the first flying capacitor and the second flying capacitor to the inductor over each of multiple control cycles of operating the network of switches substantially equalizes the magnitude of the first voltage to the magnitude of the second voltage.

3. The apparatus as in claim 1, wherein the network of switches is operative to simultaneously supply a first current from the first flying capacitor and a second current from the second flying capacitor to produce the output voltage.

4. The apparatus as in claim 1, wherein the inductor is operative to receive the energy as first current from the first flying capacitor and second current from the second flying capacitor.

5. The apparatus as in claim 4, wherein the inductor is operative to receive the first current and the second current at a node coupling the first flying capacitor to the second flying capacitor.

6. The apparatus as in claim 1, wherein the network of switches includes first switches and second switches, the apparatus further comprising:
a controller operative to regulate the magnitude of the output voltage via controlling the first switches and the second switches using a same duty cycle.

7. The apparatus as in claim 6, wherein the controller is operative to determine the duty cycle based on an error voltage derived from comparing the magnitude of the output voltage to the setpoint reference voltage.

8. The apparatus as in claim 6, wherein the controller is operative to determine the duty cycle based on monitoring a magnitude of output current supplied by the inductor to the load.

9. The apparatus as in claim 1 further comprising:
a controller operative to control switching of the network of switches in accordance with a 2 phase buck conversion of an input voltage into the output voltage via the energy received from the first flying capacitor and the second flying capacitor.

10. The apparatus as in claim 1, wherein the inductor is operative to output the output voltage from an output node of the inductor, the apparatus further comprising:
a controller operative to switch between multiple modes including:
i) a first mode in which the first flying capacitor and the second flying capacitor are connected in series between the input voltage source and the reference voltage node, the first flying capacitor being connected to the input voltage source while the second flying capacitor is connected to the reference voltage node, an input node of the inductor coupled to a circuit node coupling the first flying capacitor to the second flying capacitor;
ii) a second mode in which the second flying capacitor and the first flying capacitor are connected in series between the input voltage source and the reference voltage node, the second flying capacitor being connected to the input voltage source while the first flying capacitor is connected to the reference voltage node; and
iii) a third mode in which the input node of the inductor is coupled to the reference voltage node.

11. The apparatus as in claim 10, wherein the multiple modes further include:
iv) a fourth mode in which the network of switches is operative to provide connectivity of the input node of the inductor to the input voltage source.

12. A system comprising:
a circuit substrate; and
wherein the apparatus of claim 1 is affixed to the circuit substrate and powers the load via the output voltage.

13. A method comprising:
receiving a circuit substrate; and
fabricating the apparatus of claim 1 on the circuit substrate.

14. The apparatus as in claim 1, wherein the magnitude of the first voltage varies over time during a respective switching cycle of switching the network of switches; and
wherein the magnitude of the second voltage varies over time during the respective switching cycle of switching the network of switches.

15. The apparatus as in claim 14, wherein the energy is received from a DC input voltage;
wherein the magnitude of the first voltage of the first flying capacitor varies above and below with respect to a fraction of a magnitude of the DC input voltage; and
wherein the magnitude of the first voltage of the first flying capacitor varies above and below with respect to the fraction of the magnitude of the DC input voltage.

16. The apparatus as in claim 1, wherein the magnitude of the first voltage is out of phase with respect to the magnitude of the second voltage.

17. The apparatus as in claim 1, wherein the magnitude of the first voltage is unregulated; and
wherein the magnitude of the second voltage is unregulated.

18. The apparatus as in claim 1, wherein a supply of current from the output voltage to the load is operative to produce a first ripple voltage associated with the first voltage and a second ripple voltage associated with the second voltage.

19. The apparatus as in claim 1, wherein a flow of current between the first flying capacitor and the second flying capacitor is operative to produce a ripple in the magnitude of the first voltage stored in the first flying capacitor and a ripple in the magnitude of the second voltage stored in the second flying capacitor.

20. The apparatus as in claim 1, wherein the first series connection of switches includes a first switch and a second switch disposed in series between the first node of the first series connection and the second node of the first series connection; and
wherein the second series connection of switches includes a third switch and a fourth switch disposed in series between the first node of the second series connection and the second node of the second series connection.

21. The apparatus as in claim 20, wherein a third node of the first series connection provides connectivity between the first switch and the second switch, the third node of the first series connection producing the output voltage; and
wherein a third node of the second series connection provides connectivity between the third switch and the fourth switch, the third node of the second series connection producing the output voltage.

22. The apparatus as in claim 21, wherein the first node of the first series connection is disposed between the third node of the first series connection and the input voltage source;
wherein the first node of the second series connection is disposed between the third node of the second series connection and the reference voltage node;
wherein the second node of the first series connection is disposed between the third node of the first series connection and the reference voltage node; and
wherein the second node of the second series connection is disposed between the third node of the second series connection and the input voltage source.

* * * * *

UNITED STATES PATENT AND TRADEMARK OFFICE
CERTIFICATE OF CORRECTION

PATENT NO. : 12,107,498 B2
APPLICATION NO. : 17/147752
DATED : October 1, 2024
INVENTOR(S) : Roberto Rizzolatti et al.

It is certified that error appears in the above-identified patent and that said Letters Patent is hereby corrected as shown below:

In the Claims

Claim 1, Line 9, replace ":" with --;--

Signed and Sealed this
Tenth Day of December, 2024

Katherine Kelly Vidal
*Director of the United States Patent and Trademark Office*